United States Patent
Watanabe

(10) Patent No.: US 7,427,744 B2
(45) Date of Patent: Sep. 23, 2008

(54) PIEZOELECTRIC ACTUATOR AND SCANNING PROBE MICROSCOPE USING THE SAME

(75) Inventor: Masafumi Watanabe, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 11/827,110

(22) Filed: Jul. 10, 2007

(65) Prior Publication Data
US 2008/0023626 A1    Jan. 31, 2008

(30) Foreign Application Priority Data
Jul. 27, 2006 (JP) ............... 2006-204109
May 21, 2007 (JP) ............... 2007-134320

(51) Int. Cl.
*H01J 40/14* (2006.01)
(52) U.S. Cl. .............. 250/216; 250/234; 359/198; 310/328; 310/345
(58) Field of Classification Search .............. 250/216, 250/234, 306, 307; 359/197–199, 214, 225; 310/311, 328, 329, 345
See application file for complete search history.

(56) References Cited

U.S. PATENT DOCUMENTS
5,579,148 A * 11/1996 Nishikawa et al. .......... 359/214

FOREIGN PATENT DOCUMENTS
JP    10173247    6/1998

* cited by examiner

*Primary Examiner*—Kevin Pyo
(74) *Attorney, Agent, or Firm*—Adams & Wilks

(57) ABSTRACT

A leaf spring 4 constituting an elastic member one end of which is fixed to a foundation 6, and other end of which is brought into contact with a laminating type piezoelectric element 2 or a driven member 5 is constituted such that a thickness is thinned from a side of the foundation 6 to a side of the laminating type piezoelectric element 2 to make a moment of inertia smaller on a side of a portion of other end held by the laminating type piezoelectric element 2 than a portion on one end side fixed to the foundation 6. Further, a strain gage sensor 8 is attached to a side face 4$a$ of the leaf spring 4 constituting one face of one end of the leaf spring 4 proximate to the laminating type piezoelectric element 2 orthogonal to a direction of elongating and contracting the laminating type piezoelectric element 2 constituting a side of the driven member 5.

10 Claims, 3 Drawing Sheets

PIEZOELECTRIC ACTUATOR AND SCANNING PROBE MICROSCOPE USING THE SAME

BACKGROUND OF THE INVENTION

The present invention relates to a piezoelectric actuator utilizing a piezoelectric effect and a scanning probe microscope using the same.

In a piezoelectric actuator using a piezoelectric element displaced by applying a voltage, there is known a structure of a laminating type piezoelectric element laminated with a plurality of piezoelectric elements for pressurizing a piezoelectric actuator by using a prepressurizing structure generally using a spring previously in order to prevent an exfoliation among layers of the respective piezoelectric elements or a distortion of a displacement by clearances among the layers to ensure a stable operation (refer to, for example, Patent Reference 1).

However, in a case of driving the piezoelectric actuator at high speed, when a resonance frequency of the spring constituting the prepressurizing structure is low, there is case of jumping up the spring by the piezoelectric element. In this case, the piezoelectric element of the piezoelectric actuator brought into contact with the prepressurizing structure is momentarily separated, during the time period, the piezoelectric element is brought into a state of not being pressurized to pose a problem that not only an operation of the piezoelectric actuator is not stabilized but also a position at which the piezoelectric element and the prepressurizing structure are separated and thereafter brought into contact with each other again is shifted from a position before being separated to change a length of the piezoelectric actuator in a displacing direction.

In order to resolve the problem, it is necessary to be able to follow the high speed operation of the piezoelectric element by using a spring having a high resonance frequency as a prepressurizing structure. As a method of realizing a spring having a high resonance frequency, there is a method of increasing a spring constant by shortening a length of the spring and thickening a thickness thereof, or a method of lightening a mass by using a light material. However, according to the former method, there is a possibility that a prepressure applied on the piezoelectric element is increased by increasing the spring constant and the piezoelectric element cannot be displaced in a case of a small-sized piezoelectric element having a small generating power used for a use of being driven at high speed. In this case, an energy for displacing is changed into a heat amount, and therefore, there is a concern that the piezoelectric element is overheated to be destructed. Further, according to the method of using the light material, generally, a material having a small density is provided with a low Young's modulus, and therefore, an effect cannot be achieved to bring about a drawback that a material is limited.

[Patent Reference 1] JP-A-10-173247

It is a problem of the invention to provide a piezoelectric actuator having a prepressurizing mechanism operated to a piezoelectric element unforcibly and stably even when driven at high speed.

Further, it is a problem of the invention to provide a piezoelectric actuator for detecting a displacement of a piezoelectric element as a large signal and promoting a detection accuracy.

Further, it is a problem of the invention to provide a scanning probe microscope having the above-described effect.

SUMMARY OF THE INVENTION

In order to resolve the problem, a piezoelectric actuator according to the invention is characterized in comprising a piezoelectric element displaced by applying a voltage, a foundation for fixing one end of the piezoelectric element, a driven member fixed to other end of the piezoelectric element, and an elastic member one end of which is directly or indirectly fixed to the foundation, other end of which is brought into contact with the piezoelectric element or the driven member, and which prepressurizes the piezoelectric element or the driven member in a compressing direction, wherein the elastic member is constituted by a shape in which a moment of inertia of a portion of the other end brought into contact with the piezoelectric element or the driven member is smaller than a moment of inertia of a portion on one end side thereof fixed to the foundation.

In the above-described elastic member having the shape in which the moment of inertia is reduced in the displacing direction in accordance with proceeding from the foundation side to the piezoelectric element or the driven member, an extremely short portion thereof on a side of the piezoelectric element or the driven member is mainly vibrated. The shorter the length of vibrating the spring, the higher the resonance frequency of the elastic member, and therefore, the resonance frequency of the elastic member can be increased by constituting the above-described shape. Further, when elastic members having the same resonance frequency are compared, a spring constant of the elastic member can be made to be smaller than that of the spring a moment of inertia of which is constant from a fixed end to a free end.

Further, the piezoelectric actuator according to the invention is characterized in that a side face of the one end of the elastic member brought into contact with the piezoelectric element or the driven member and having the small moment of inertia is attached with a strain gage sensor to be spaced apart from the piezoelectric element or the driven member by an interval of not being brought into contact therewith in the above-described piezoelectric actuator.

When the elastic member of the structure having the strain gage sensor to be spaced apart from the piezoelectric element by the interval of not being brought into contact therewith is used to the side face of the one end brought into contact with the piezoelectric element or the driven member having the small moment of inertia as a prepressurizing structure, a strain produced at the elastic member when the piezoelectric element is displaced is concentrated on a periphery of an end portion on a side of the piezoelectric element or the driven member, and therefore, by attaching the strain gage sensor to the portion, the displacement of the piezoelectric element can be detected as a large signal.

Further, a scanning probe microscope according to the invention is characterized in comprising a cantilever having a probe at a front end thereof, a stage mounted with a sample arranged opposedly to the probe, moving means for moving the probe and the sample relative to each other in a direction in parallel with a surface of the sample, and measuring means for measuring a displacement of the cantilever in a vibrating state, wherein the above-described piezoelectric actuator is used for the moving means.

According to the piezoelectric actuator according to the invention, the following effect is achieved.

The elastic member constituting the prepressurizing structure is provided with a high resonance frequency, and therefore, even when the piezoelectric actuator is driven to vibrate at high speed, it is difficult to jump up the elastic member. Further, since the spring constant of the prepressurizing structure is small, and excessively large prepressurizing load is not applied to the piezoelectric element, the displacement of the piezoelectric element can stably be measured, and the piezoelectric actuator can stably be operated at high speed.

Further, when the elastic member having the above-described shape is used as the prepressurizing structure, a strain produced at the elastic member when the piezoelectric element is displaced is concentrated on the periphery of the end portion on a side of the piezoelectric element, and therefore, by attaching the strain gage sensor to the portion, the displacement of the piezoelectric element can be detected as the large signal, and a detection accuracy can be promoted.

According to the scanning probe microscope according to the invention, the above-described piezoelectric actuator is used as the moving means, and therefore, a stable measurement can be carried out, and also the detection accuracy can be promoted.

DETAILED DESCRIPTION OF THE PREFERRED EMBODIMENT

Figure 1:
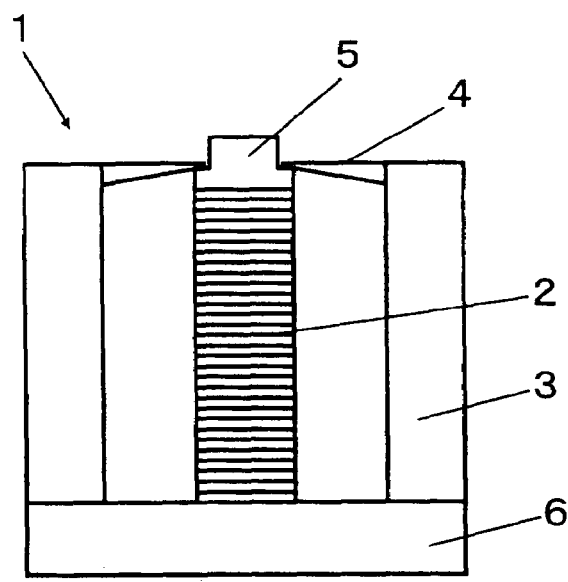
FIG. 1 is an outline view showing a constitution of a piezoelectric actuator in a first embodiment according to the invention.

A first embodiment of a piezoelectric actuator according to the invention will be explained in reference to an outline constitution view of FIG. 1 as follows.

That is, a piezoelectric actuator 1 according to the first embodiment comprises a laminating type piezoelectric element 2 constituting a piezoelectric element displaced by applying a voltage, a foundation 6 for fixing one end of the laminating type piezoelectric element 2, a driven member 5 fixed to other end of the laminating type piezoelectric element 2, and a leaf spring 4 constituting an elastic member one end of which is indirectly fixed to the foundation 6, other end of which is brought into contact with the laminating type piezoelectric element 2 and which prepressurizes the laminating type piezoelectric element 2 in a compressing direction, and is characterized in that the leaf spring 4 is constituted by a shape by which a moment of inertia of a portion thereof on other end brought into contact with the laminating type piezoelectric element 2 is smaller than that of a portion thereof on one end side fixed to the foundation 6.

Specifically, according to the piezoelectric actuator 1 of the embodiment, one end of the laminating type piezoelectric element 2 laminated with piezoelectric elements is fixed to the foundation 6. The other end is adhered with the driven member 5 moved by displacing the laminating type piezoelectric element 2. Further, a case 3 connected to the foundation 6 is provided in a displacing direction of elongating and contracting the laminating type piezoelectric element 2 opposedly thereto. Although according to the embodiment, the foundation and the case are constituted by separate members, there may be constructed a constitution of integrating the foundation and the case.

Here, according to the embodiment, as the elastic member, there is constructed a structure of reducing the moment of inertia continuously or in steps from the one end side fixed to the foundation 6 to the other end brought into contact with the laminating type piezoelectric element 2, and there is used the elastic member having a structure of reducing a sectional area continuously or in steps from the one end side indirectly fixed to the foundation 6 to the other end brought into contact with the laminating type piezoelectric element 2.

Further specifically, as the elastic member, there is used the leaf spring 4 thinning a thickness thereof continuously or in steps from the one end side indirectly fixed to the foundation 6 to the other end brought into contact with the laminating type piezoelectric element 2, and there is used the leaf spring 4 having a structure of changing the thickness in the displacing direction of the laminating type piezoelectric element 2. The one end of the leaf spring 4 having the thick thickness is fixed to the case 3, and the side of the leaf spring 4 having the thin thickness is brought into contact with the driven member 5 to press in a compressing direction of displacing the laminating type piezoelectric element 2. That is, the leaf spring 4 is attached to the case 3 to be indirectly attached to the foundation 6. In this case, a free end of the leaf spring 4 on the side of the laminating type piezoelectric element 2 may be adhered to the driven member 5. Further, there may be constituted a structure of pressing the laminating type piezoelectric element 2 on the side of the driven member 5 directly by the leaf spring 4.

Although according to the embodiment, an explanation has been given of a shape of the elastic member constituting the prepressurizing structure as a leaf spring structure having a thin free end side, the shape is not limited to such a shape but there may be constituted a shape of reducing the moment of inertia as described above in a direction from the one end of the elastic member fixed to the case to the free end for pressing the driven member 5 or the laminating type piezoelectric element 2 on the side of the driven member 5. That is, the elastic member may be constituted by a shape of a belleville spring thinning a thickness thereof continuously or in steps from an outer periphery to a center centering on the displacing direction of the laminating type piezoelectric element 2 from one end side indirectly fixed to the foundation 6 to other end brought into contact with the laminating type piezoelectric element 2 or the driven member 5, specifically, a shape of a belleville spring thinning a thickness thereof to a side of the laminating type piezoelectric element 2 constituting a free end of the elastic member in accordance with a center direction. In this case, there is constituted a structure constituting a fixed end side by an outer peripheral portion on the side of the case 3 and prepressurizing the driven member 5 or the laminating type piezoelectric element 2 at a center portion thereof. Also in this case, the belleville spring is attached to the case 3 to be indirectly attached to the foundation 6.

Further, as described above, there may be used an elastic member of reducing a sectional area continuously or in steps from a fixed end to a free end. Thereby, since the piezoelectric element is provided with a vibration component also in a direction other than the displacing direction, there is constituted a shape of reducing the moment of inertia in a direction other than the displacing direction in accordance with being proximate to the side of the piezoelectric element, and therefore, also a resonance frequency in the direction other than the displacing direction of the piezoelectric element can be increased.

According to the embodiment, there is constituted a structure in which the resonance frequency of the elastic member per se of the leaf spring 4 is higher than a frequency band of driving the laminating type piezoelectric element 2 and a total of a pressure applied to the laminating type piezoelectric element 2 by the elastic member becomes smaller than a generated force of the laminating type piezoelectric element 2. That is, according to the embodiment, the elastic member constituting the prepressurizing structure is provided with the high resonance frequency, and therefore, even when the piezoelectric actuator is driven to vibrate at high speed, the elastic member is difficult to be jumped up. Further, since the spring constant of the prepressurizing structure is small, an excessively large prepressurizing load is not applied to the piezoelectric element, the displacement of the piezoelectric element can stably be measured and the piezoelectric actuator can stably be operated at high speed.

Figure 2:
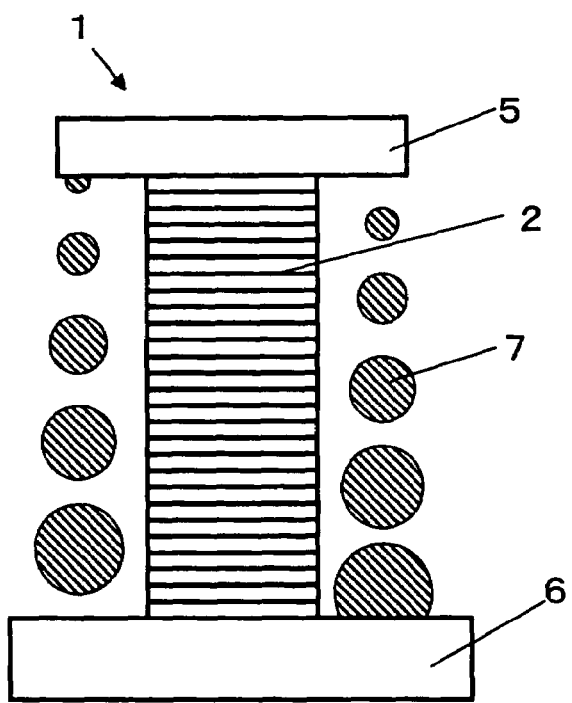
FIG. 2 is an outline view showing a constitution of a piezoelectric actuator in a second embodiment according to the invention.

Next, FIG. 2 shows an outline constitution view of a second embodiment of a piezoelectric actuator according to the invention. Further, members the same as those of the first embodiment are attached with the same notations and an explanation thereof will be omitted.

That is, the piezoelectric actuator 1 of the second embodiment is constituted by the laminating type piezoelectric element 2 constituting the piezoelectric element displaced by applying a voltage, the foundation 6 for fixing one end of the laminating type piezoelectric element 2, the driven member 5 fixed to other end of the laminating type piezoelectric element 2, and a coil spring 7 constituting an elastic member one end of which is directly fixed to the foundation 6, other end of which is brought into contact with the driven member 5 and which prepressurizes the laminating type piezoelectric element 2 in a compressing direction, the coil spring 7 is characterized in being constituted by a shape in which a moment of inertia on a side of a portion of other end brought into contact with the driven member 5 is smaller than that of a portion of one end side fixed to the foundation 6.

Here, according to the embodiment, as the elastic member, there is used an elastic member having a structure in which the moment of inertia is reduced continuously or in steps from the one end side fixed to the foundation 6 to the other end brought into contact with the driven member 5, and a structure in which a sectional area thereof is reduced continuously or in steps from the one end side directly fixed to the foundation 6 to the other end brought into contact with the driven member 5. Further specifically, as the elastic member, there is used the coil spring 7 comprising a wire a boldness of which becomes slender continuously or in steps from the one end side directly fixed to the foundation 6 and to the other end brought into contact with the driven member 5. That is, as the elastic member constituting a prepressurizing structure, there is used the coil spring 7 constituted by rounding the wire the boldness of which becomes slender from the one end to the other end. According to the embodiment, the one end of the coil spring 7 having a large diameter is directly fixed to the foundation 6, a side of the coil spring 7 having a small diameter is fixed to the driven member 5 and fixed to attract the driven member 5 in a compressing direction of displacing the laminating type piezoelectric element 2. Further, the elastic member may be constituted by a shape of a needle-like spring having a sectional area which is reduced from a fixed end side of the side of the foundation 6 to the side of the piezoelectric element.

According to the embodiment, there is constituted a structure in which a resonance frequency of the elastic member per se such as the coil spring 7 is larger than a frequency band of driving the laminating type piezoelectric element 2 and a total of a pressure applied to the laminating type piezoelectric element 2 by the elastic member becomes smaller than a generated force of the laminating type piezoelectric element 2. That is, according to the embodiment, the elastic member constituting the prepressurizing structure is provided with the high resonance frequency, and therefore, even when the piezoelectric actuator is driven to vibrate at high speed, the elastic member is difficult to be jumped up. Further, a spring constant of the prepressurizing structure is small, and therefore, an excessively large prepressurizing load is not applied to the piezoelectric element, a displacement of the piezoelectric element can stably be measured, and the piezoelectric actuator can stably be operated at high speed.

Figure 3:
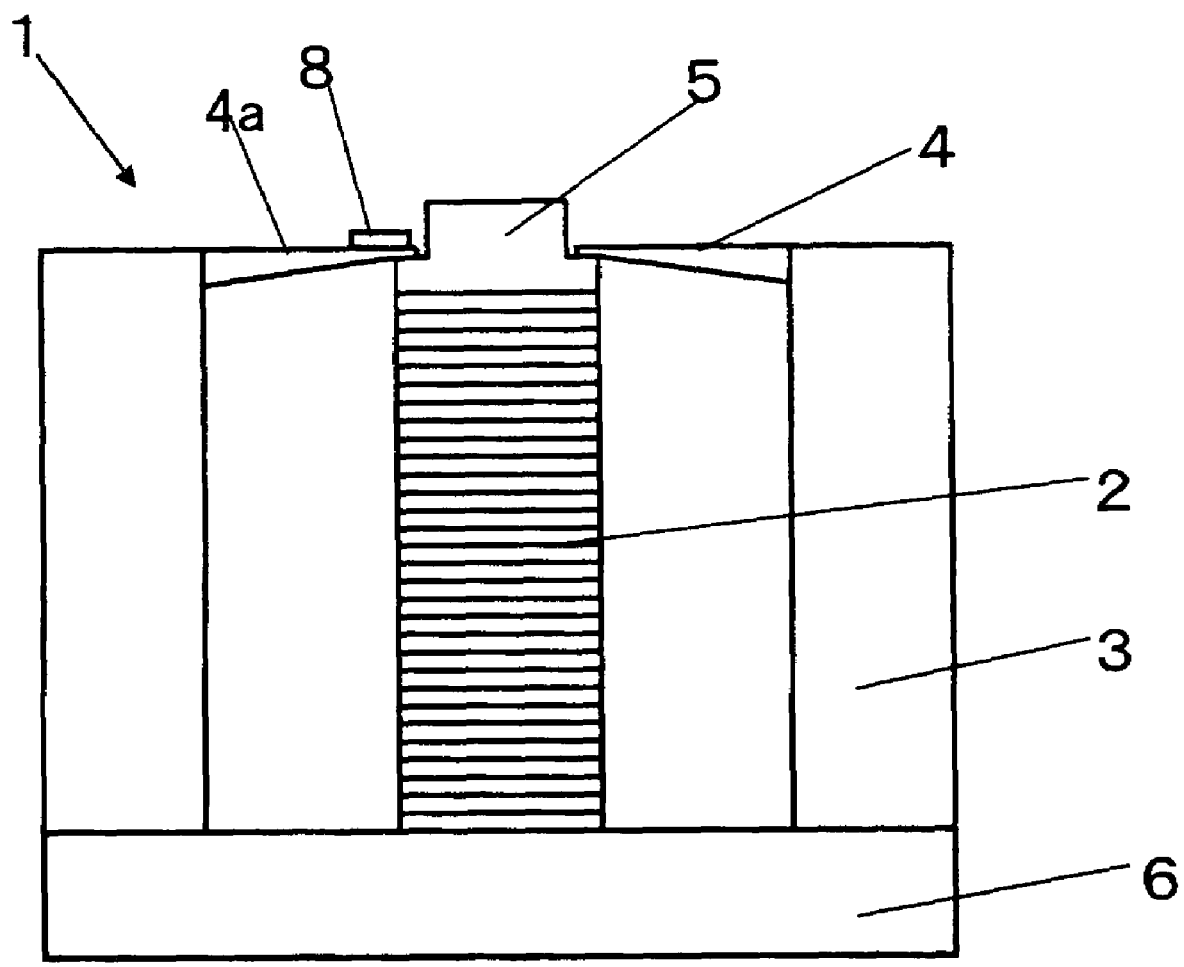
FIG. 3 is an outline view showing a constitution of a piezoelectric actuator in a third embodiment according to the invention.

Further, FIG. 3 shows an outline view of a third embodiment of a piezoelectric actuator according to the invention. According to the third embodiment, a shape of an elastic member constituting a prepressurizing structure is made to be similar to that of the first embodiment, members the same as those of the first embodiment are attached with the same notations, and an explanation thereof will be omitted.

Here, according to the piezoelectric actuator of the embodiment, a face of one end of the leaf spring 4 constituting the elastic member brought into contact with the laminating type piezoelectric element 2 and having a small moment of inertia is attached with a strain gage sensor 8 spaced apart from the laminating type piezoelectric element 2 or the driven member 5 by an interval of not being brought into contact therewith. Further specifically, as shown by FIG. 3, there is constituted a structure of attaching the strain gage sensor 8 to a side face 4a constituting one face of one end of the leaf spring 4 constituting the prepressurizing structure proximate to the laminating type piezoelectric element 2 orthogonal to a direction of elongating and contracting the laminating type piezoelectric element 2 and constituting a side of the driven member 5.

Further, the strain gage sensor 8 is attached by being adhered by using an adhering agent or vapor-depositing a bridge circuit on the leaf spring 4 constituting the elastic member. According to a method of attaching by vapor deposition, when the leaf spring 4 constituting the elastic member is an insulating member, the strain gage may be formed by vapor-depositing a metal of gold or the like or a material having a high gage rate of Cu—Ni, Cr—N or the like directly on the leaf spring 4, when the leaf spring 4 is a conductive member, and insulating film may be vapor-deposited on a surface of the elastic member, and the strain gage may be vapor-deposited thereon to form as described above.

As described above, the leaf spring constituting the elastic member constituting the prepressurizing structure of the piezoelectric actuator according to the invention is constituted by the structure in which the moment of inertia is continuously reduced from the one end side of being fixed to the foundation 6 to the other end of being brought into contact with the laminating type piezoelectric element 2, and therefore, a strain produced at the leaf spring 4 constituting the elastic member when the laminating type piezoelectric element 2 is displaced is concentrated on the side face 4a of the end portion on the side of the laminating type piezoelectric element 2 having the least moment of inertia. Therefore, the strain gage sensor 8 is attached to the side face 4a of the end portion of the leaf spring 4 on the side of the laminating type piezoelectric element 2 having the least moment of inertia. Therefore, according to the embodiment, the displacement of the laminating type piezoelectric element 2 can be detected as a large signal more than in the case of attaching the strain gage sensor to the prepressurizing structure using the leaf spring on the flat plate of the background art in which the strain is produced uniformly over a total of the leaf spring constituting the elastic member as in the background art, and a detection accuracy can be promoted.

Also in the embodiment, there is constituted a structure in which the resonance frequency of the elastic member per se such as the leaf spring 4 is higher than the frequency band of driving the laminating type piezoelectric element 2 and the total of the pressure applied to the laminating type piezoelectric element 2 by the elastic member becomes smaller than the generated force of the laminating type piezoelectric element 2. That is, also in the embodiment, the elastic member constituting the prepressurizing structure is provided with the high resonance frequency, and therefore, even when the piezoelectric actuator is driven to vibrate at high speed, it is difficult to jump up the elastic member. Further, since the spring constant of the prepressurizing structure is small, the excessively large prepressurizing load is not applied to the piezoelectric element, the displacement of the piezoelectric element can stably be measured, and the piezoelectric actuator can stably be operated at high speed.

Although according to the third embodiment, an explanation has been given by taking an example by the leaf spring used in the first embodiment as the elastic member, as the elastic member, other mode of the elastic member described in the first embodiment and the coil spring or other mode of elastic member used in the second embodiment can be used.

Next, a scanning probe microscope according to the invention will be explained in reference to FIG. 4.

Figure 4:
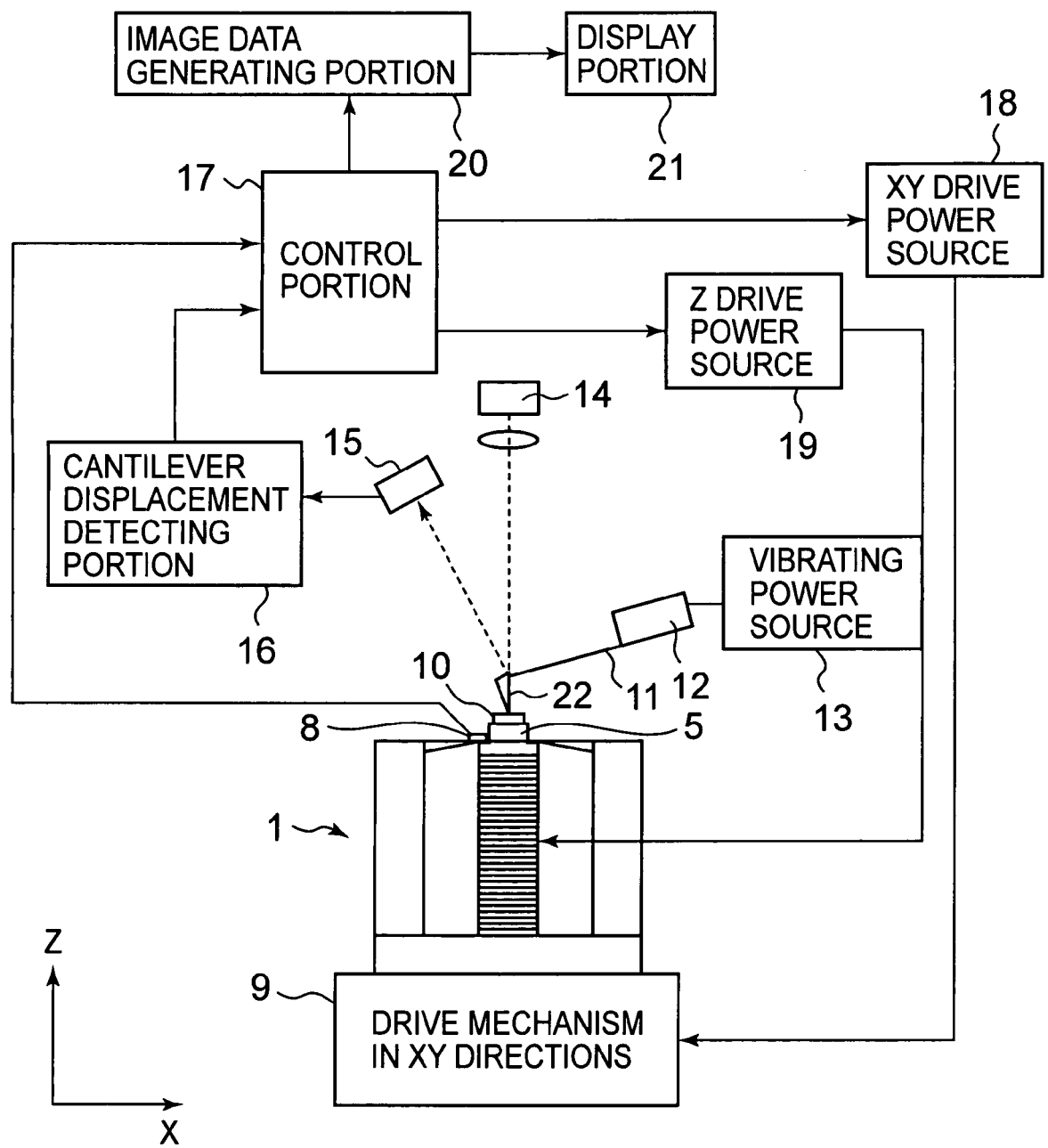
FIG. 4 is an outline view showing a constitution of an embodiment of a scanning probe microscope according to the invention.

As shown by FIG. 4, the scanning probe microscope of the embodiment includes a cantilever 11 having a probe 22 at a front end thereof, a stage, not illustrated, for mounting a sample 10 constituting a sample arranged oppositely to the probe 22, the piezoelectric actuator 1 constituting moving means for moving the probe 22 and the sample 10 relative to each other in a direction in parallel with a surface of the sample 10, and measuring means for measuring a displacement in a vibrating state of the cantilever 11. Further, according to the scanning probe microscope of the embodiment, the stage is arranged above the driven member 5 of the piezoelectric actuator.

Further, according to the scanning probe microscope of the embodiment, as shown by FIG. 4, the sample 10 is arranged above the stage, not illustrated, mounted above the driven member 5 of the piezoelectric actuator explained in the third embodiment. That is, according to the scanning probe microscope of the embodiment, the sample 10 is moved in Z direction constituting a longitudinal direction of a paper face. Further, according to the scanning probe microscope of the embodiment, the sample 10 is moved in XY directions constituting two directions orthogonal to the paper face by a driving mechanism 9 in XY directions. Therefore, a position of the sample 10 can be moved three-dimensionally in XYZ directions by the moving mechanism and a position thereof relative to the probe 22 can be changed.

Further, the piezoelectric actuator 1 similar to that described in the third embodiment is used, and therefore, the same notations are attached and an explanation thereof will be omitted. Further, the scanning probe microscope of the embodiment includes a cantilever vibrating portion 12 for vibrating the cantilever 11 and a vibrating power source 13 for driving the cantilever vibrating portion 12 as illustrated.

Further, laser light is irradiated from a laser light irradiating portion 14 to the cantilever 11, and the laser light reflected from the cantilever 11 is incident on a photodetector 15, and an amount of displacing the cantilever 11 is detected by a cantilever displacement detecting portion 16 from a position of incidence thereof. Further, based on the displacement of the cantilever 11 detected by the cantilever displacement detecting portion 16, a predetermined control signal is outputted from a control portion 17 to a Z drive power source 19 for driving the piezoelectric actuator 1 to control positions in Z direction of the probe 22 and the sample 10 relative to each other by driving the piezoelectric actuator 1. That is, according to the scanning probe microscope of the embodiment, the displacement of the cantilever 11 produced by an atomic force operated between the sample 10 and the probe 22 is detected by the above-described mechanism and the positions of the probe 22 and the sample 10 relative to each other are controlled by the above-described mechanism to maintain an amount of displacing the cantilever 11 constant.

When an observation is carried out by the scanning probe microscope of the embodiment, while scanning the positions of the sample 10 and the probe 22 relative to each other in XY directions by the drive mechanism 9 in XY directions by outputting the predetermined control signal to an XY drive power source 18 for driving the drive mechanism 9 in XY directions from the control portion 17, a displacement produced at the cantilever 11 by the atomic force generated by recesses and the projections of the surface of the sample 10 or interactive operation between the sample 10 and the front end of the probe 22 is detected by the cantilever displacement detecting portion 16, and the positions in Z direction of the probe 22 and the sample 10 relative to each other are controlled by the piezoelectric actuator 1 according to the invention such that an amount of displacement becomes constant. By controlling in this way, the observation is carried out by drawing a shape, a physical property or the like of the surface of the sample 10 from the positions in XY directions and the drive signal of the piezoelectric actuator 1 in Z direction.

At this occasion, according to the scanning probe microscope of the embodiment, the piezoelectric actuator 1 attached with the strain gage sensor 8 as shown by the third embodiment is used, and by using not the drive signal of the piezoelectric actuator 1 in Z direction based on the amount of displacing the cantilever 11 as described above but the output signal of the strain gage sensor 8 as the signal in Z direction, the displacement of the laminating type piezoelectric element 2 is detected as the large signal, and the highly accurate observation excluding a hysteresis of the piezoelectric element can be carried out by carrying out the observation promoting the detection accuracy. Further, according to the scanning probe microscope of the embodiment, measured data provided from the cantilever displacement detecting portion 16 is naturally transmitted to the control portion 17 and transmitted to an image data generating portion 20 to be converted into an image, which is displayed at a display portion 21.

In the scanning probe microscope according to the invention, the above-described piezoelectric actuator is used as the moving means, and therefore, stable measurement can be carried out, and also the detection accuracy can be promoted.

Further, in the above-described respective embodiments, there may be constituted a structure in which the elastic member constituting the prepressurizing structure is not only one but the piezoelectric element may be prepressurized by using a plurality of elastic members. Further, although in the above-described respective embodiments, an explanation has been given such that the piezoelectric element is the laminating type piezoelectric element, the piezoelectric element is not limited to the laminating type piezoelectric element but may be a bulk piezoelectric element.

What is claimed is:

1. A piezoelectric actuator characterized in comprising:
   a piezoelectric element displaced by applying a voltage;
   a foundation for fixing one end of the piezoelectric element;
   a driven member fixed to other end of the piezoelectric element; and an elastic member one end of which is directly or indirectly fixed to the foundation, other end of which is brought into contact with the piezoelectric element or the driven member, and which prepressurizes the piezoelectric element or the driven member in a compressing direction;

wherein the elastic member is constituted by a shape in which a moment of inertia of a portion of the other end brought into contact with the piezoelectric element or the driven member is smaller than a moment of inertia of a portion on one end side thereof fixed to the foundation.

2. The piezoelectric actuator according to claim 1, characterized in that the elastic member is constituted by a structure in which the moment of inertia is reduced continuously or in steps from the one end side fixed to the foundation to the other end brought into contact with the piezoelectric element or the driven member.

3. The piezoelectric actuator according to claim 1, characterized in that a face of the one end of the elastic member brought into contact with the piezoelectric element or the driven member and having the small moment of inertia is attached with a strain gage sensor to be spaced apart from the piezoelectric element or the driven member by an interval of not being brought into contact therewith.

4. The piezoelectric actuator according to claim 1, characterized in that the piezoelectric element is a laminating type piezoelectric element laminated with a plurality of piezoelectric elements.

5. The piezoelectric actuator according to claim 1, characterized in that the elastic member is constituted by a structure in which a sectional area thereof is reduced continuously or in steps from one end side directly or indirectly fixed to the foundation to other end brought into contact with the piezoelectric element or the driven member.

6. The piezoelectric actuator according to claim 1, characterized in that the elastic member is a leaf spring a thickness of which is thinned continuously or in steps from one end side indirectly fixed to the foundation to other end brought into contact with the piezoelectric element or the driven member.

7. The piezoelectric actuator according to claim 1, characterized in that the elastic member is a belleville spring a thickness of which is thinned continuously or in steps from an outer periphery thereof to a center thereof centering on a direction of displacing the piezoelectric element from one end side indirectly fixed to the foundation to other end brought into contact with the piezoelectric element or the driven member.

8. The piezoelectric actuator according to claim 1, characterized in that the elastic member is a coil spring comprising a wire a boldness of which becomes slender continuously or in steps from one end side directly fixed to the foundation to other end brought into contact with the piezoelectric element or the driven member.

9. A scanning probe microscope characterized in comprising:
a cantilever having a probe at a front end thereof;
a stage mounted with a sample arranged opposedly to the probe;
moving means for moving the probe and the sample relative to each other in a direction in parallel with a surface of the sample; and
measuring means for measuring a displacement of the cantilever in a vibrating state; and
wherein the piezoelectric actuator according to claim 1 is used for the moving means.

10. The scanning probe microscope according to claim 9, characterized in that the stage is arranged above the driven member.

* * * * *